United States Patent
Wang et al.

(10) Patent No.: US 8,421,173 B2
(45) Date of Patent: Apr. 16, 2013

(54) CHIP PACKAGE STRUCTURE AND CHIP PACKAGING PROCESS

(75) Inventors: Wei-Chung Wang, Hsinchu (TW); Sen-Huang Huang, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 66 days.

(21) Appl. No.: 13/210,485

(22) Filed: Aug. 16, 2011

(65) Prior Publication Data
US 2012/0168945 A1 Jul. 5, 2012

(30) Foreign Application Priority Data

Dec. 31, 2010 (TW) .............................. 99147330 A (51) Int. Cl.
*H01L 31/0232* (2006.01)
*H01L 21/00* (2006.01)
*H01L 21/84* (2006.01)

(52) U.S. Cl.
USPC .............. 257/432; 257/466; 438/162; 438/68

(58) Field of Classification Search .................. 257/432, 257/622, 466, 778, 444, 440, 621, 625; 438/7, 438/8, 9, 15, 16, 17, 65, 68, 162, 461, FOR. 386
See application file for complete search history.

(56) References Cited

U.S. PATENT DOCUMENTS

| 5,270,673 | A | 12/1993 | Fries et al. |
| 7,615,487 | B2 | 11/2009 | Chang |
| 8,229,537 | B2 * | 7/2012 | Chandrasekaran et al. .. 600/372 |
| 2007/0013268 | A1 * | 1/2007 | Kubo et al. ..................... 310/324 |
| 2007/0251339 | A1 * | 11/2007 | Wiese et al. ................. 73/866.1 |
| 2009/0074352 | A1 * | 3/2009 | Kohashi et al. ................. 385/14 |
| 2012/0037949 | A1 * | 2/2012 | Jeong ............................. 257/99 |

* cited by examiner

*Primary Examiner* — S. V. Clark
(74) *Attorney, Agent, or Firm* — WPAT PC; Justin King (57) ABSTRACT

A chip package structure includes a silicon substrate, a sensing component, a metal circuit layer, a first insulating layer and a conductive metal layer. The silicon substrate has opposite first and second surfaces. The sensing component is disposed on the first surface. The metal circuit layer is disposed on the first surface and electrically connected to the sensing component. The first insulating layer covers the second surface and has a first through hole to expose a portion of the second surface. The conductive metal layer is disposed on the first insulating layer and includes first leads and a second lead. The first leads are electrically connected to the metal circuit layer. The second lead is filled in the first through hole to electrically connect to the silicon substrate and one of the first leads. A chip packaging process for fabricating the chip package structure is also provided.

21 Claims, 9 Drawing Sheets

CHIP PACKAGE STRUCTURE AND CHIP PACKAGING PROCESS

FIELD OF THE INVENTION

The present invention relates to a chip package, and more particularly to a chip package structure and a chip packaging process.

BACKGROUND OF THE INVENTION

With rapid development of semiconductor technology, the properties of integrated circuit (IC) have continuously increased. The structure of the integrated circuit becomes more complicated, so the manufacture method of the integrated circuit, more specifically, the packaging method of the integrated circuit should be continuously developed.

Figure 1:
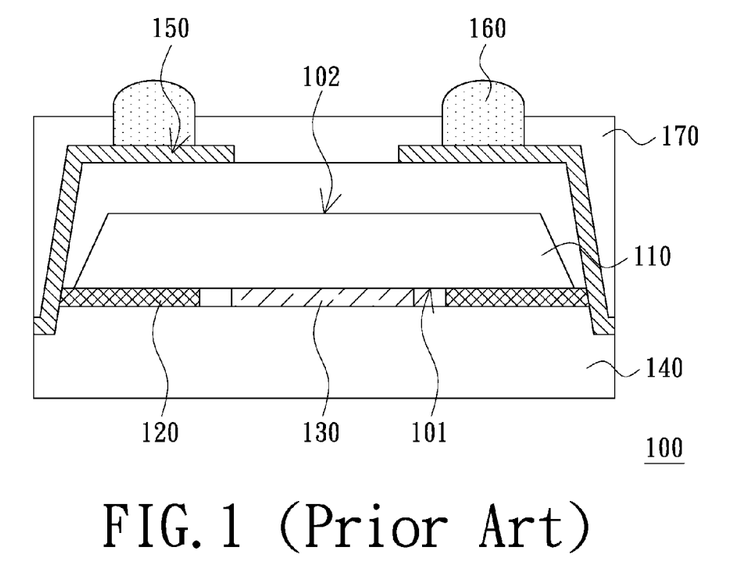
FIG. 1 is a schematic, cross sectional view of a chip package structure of a conventional optical integrated circuit.

Chip scale package (CSP) is a kind of high density package technical widely used at present. FIG. 1 is a schematic, cross sectional view of a chip package structure of a conventional optical integrated circuit. Referring to FIG. 1, a silicon structure 110 of the conventional chip package structure 100 includes a first surface 101 and a second surface 102 opposite to the first surface 101. The circuit layer 120 and an optical sensing chip 130 electrically connected to the circuit layer 120 are disposed on the first surface 101 of the silicon substrate 110, and covered by a transparent layer 140. The circuit layer 120 is electrically connected to outside component by leads 150 and solder balls 160. The second surface 102 of the silicon substrate 110 is usually enclosed by an encapsulation 170.

However, in the conventional chip package structure 100, the silicon substrate 110 is merely used for bearing the circuit layer 120 and the optical sensing chip 130, but could not be electrically connected to outside component such as printed circuit board. Thus, the silicon substrate 110 could not be electrically connected to ground.

SUMMARY OF THE INVENTION

The present invention provides a chip package structure whose silicone substrate can be electrically connected to outside component.

The present invention further provides a chip packaging process of fabricating a chip package structure to make a silicone substrate of the chip package structure be electrically connected to outside component.

In order to achieve at least of the above-mentioned advantages, the present invention provides a chip package structure including a silicon substrate, a sensing component, a metal circuit layer, a first insulating layer and a conductive metal layer. The silicon substrate has a first surface and a second surface opposite to the first surface. The sensing component is disposed on the first surface. The metal circuit layer is disposed on the first surface and is electrically connected to the sensing component. The first insulating layer covers the second surface and has a first through hole to expose a portion of the second surface. The conductive metal layer is disposed on the first insulating layer and includes a plurality of first leads and a second lead. The first leads are electrically connected to the metal circuit layer. The second lead is filled in the first through hole so as to electrically connect to the silicon substrate and at least one of the first leads.

In one embodiment of the present invention, the chip package structure further includes a protective layer, wherein the metal circuit layer and the sensing component are covered by the protective layer.

In one embodiment of the present invention, the protective layer is made of epoxy resin.

In one embodiment of the present invention, the chip package structure further includes a protective substrate disposed on the protective layer.

In one embodiment of the present invention, the protective substrate is a transparent substrate.

In one embodiment of the present invention, the first lead electrically connected to the second lead is one of a ground lead and a power lead.

In one embodiment of the present invention, the chip package structure further includes a second insulating layer and a plurality of solder balls. The second insulating layer covers the first leads and the second lead. The second insulating layer has a plurality of second through holes to expose a portion of each first lead. The solder balls are respectively disposed in the second through holes to electrically connect to the first leads.

In one embodiment of the present invention, the silicon substrate has a plurality of through silicon vias, and the first leads are electrically connected to the metal circuit layer by the through silicon vias.

In one embodiment of the present invention, the conductive metal layer includes a plurality of sub-metal layers. The sub-metal layers include a first sub-metal layer and a second sub-metal layer stacked together with the first sub-metal layer. The first sub-metal layer is different from the second sub-metal layer. The first sub-metal layer is disposed between the second sub-metal layer and the first insulating layer for being adhered to the second sub-metal layer and the first insulating layer.

In order to achieve at least of the above-mentioned advantages, the present invention provides a chip packaging process. The chip packaging process includes the following steps. First, a silicon wafer is provided, and the silicon wafer has a first surface and a second surface opposite to the first surface. The first surface has a metal circuit layer and a plurality of sensing components electrically connected to the metal circuit layer. Then, a plurality of notches is formed in the silicon wafer for defining a plurality of chip units and exposing the metal circuit layer, wherein each of the chip units includes one of the sensing components. Next, a first insulating layer is formed on the second surface of the silicon wafer and the first insulating layer is further filled in the notches. Next, a plurality of openings is formed in the first insulating layer and the openings are correspondingly located in the notches. A plurality of first through holes is formed in portions of the first insulating layer corresponding to the chip units to expose portions of the second surface. Then, a conductive metal layer is formed on the first insulating layer. The conductive metal layer includes a plurality of first leads and a plurality of second leads. The first leads are electrically connected to the metal circuit layer. The second leads are filled in the first through holes respectively to be electrically connected to the silicon wafer and at least one of the first leads. Then, the silicon wafer is cut along the notches for separating the chip units.

In one embodiment of the present invention, before forming the notches, the chip packaging process further includes forming a protective layer on the silicon wafer to cover the metal circuit layer and the sensing components.

In one embodiment of the present invention, the chip packaging process further includes disposing a protective substrate on the protective layer.

In one embodiment of the present invention, the protective substrate is a transparent substrate.

In one embodiment of the present invention, after disposing the protective substrate, the chip packaging process further includes performing a wafer thinning process. The wafer thinning process includes grinding the second surface of the silicon wafer for forming a grinding surface; and performing a planarization process for the grinding surface.

In one embodiment of the present invention, the method of forming the notches includes performing a lithography etching process.

In one embodiment of the present invention, after forming the openings, the metal circuit layer is exposed, and when forming the conductive metal layer, the conductive metal layer is filled in the openings to let the first leads be electrically connected to the metal circuit layer.

In one embodiment of the present invention, the conductive metal layer includes a plurality of sub-metal layers, and the method of forming the conductive metal layer includes the following steps. First, a first sub-metal layer is formed to cover the first insulating layer and the first sub-metal layer is further filled in the openings and the first through holes. Then, the first sub-metal layer is etched to form the first leads and the second leads. Then, a second sub-metal layer is formed to stack on the first leads and the second leads.

In one embodiment of the present invention, the conductive metal layer includes a plurality of sub-metal layers, and the method of forming the conductive metal layer includes the following steps. First, a first sub-metal layer is formed to cover the first insulating layer and the first sub-metal layer is filled in the openings and the first through holes. Then, a second sub-metal layer is formed to cover the first sub-metal layer. Then, the first sub-metal layer and the second sub-metal layer are etched to form the first leads and the second leads.

In one embodiment of the present invention, material of the first sub-metal layer includes aluminum or copper, and material of the second sub-metal layer includes nickel or gold.

In one embodiment of the present invention, the chip packaging process further includes the following steps of forming a second insulating layer on the first insulating layer to cover the first leads and the second leads, forming a plurality of second through holes in the second insulating layer to expose a portion of each first lead, and forming a plurality of solder balls in the second through holes to electrically connect to the first leads, respectively.

In one embodiment of the present invention, the chip packaging process further includes forming a plurality of through silicon vias in the silicon wafer, wherein the first leads are electrically connected to the metal circuit layer by the through silicon vias.

In the chip package structure and the chip packaging process of the present invention, the second lead disposed in the first through hole defined in the first insulating layer enables the silicon substrate to be electrically connected to outside component (such as the printed circuit board) directly. Therefore, the silicon substrate could be electrically connected to ground directly, and this facilitates performing a signal test to the silicon substrate and maintaining the electrical potential of the silicon substrate at the lowest electric potential.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 4A to 4M show a flow chart of a chip packaging process according to an embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
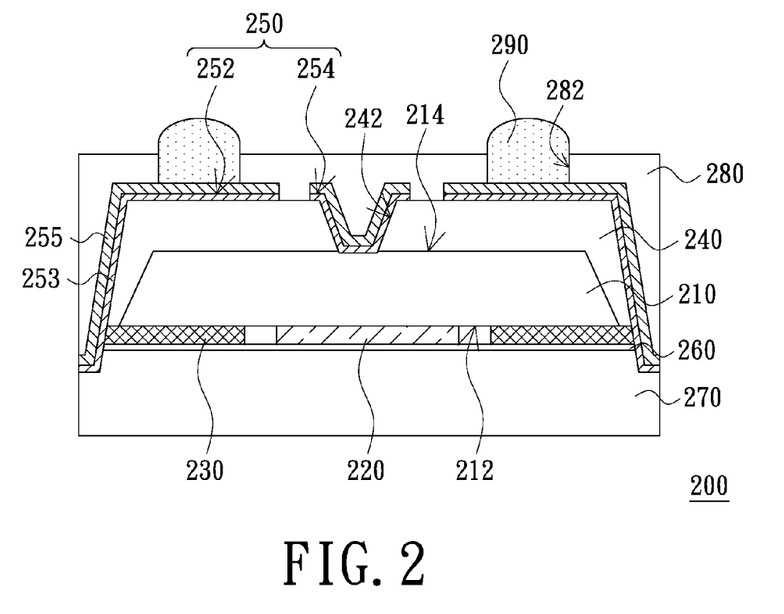
FIG. 2 is a schematic, cross sectional view of a chip package structure according to an embodiment of the present invention.
Figure 3:
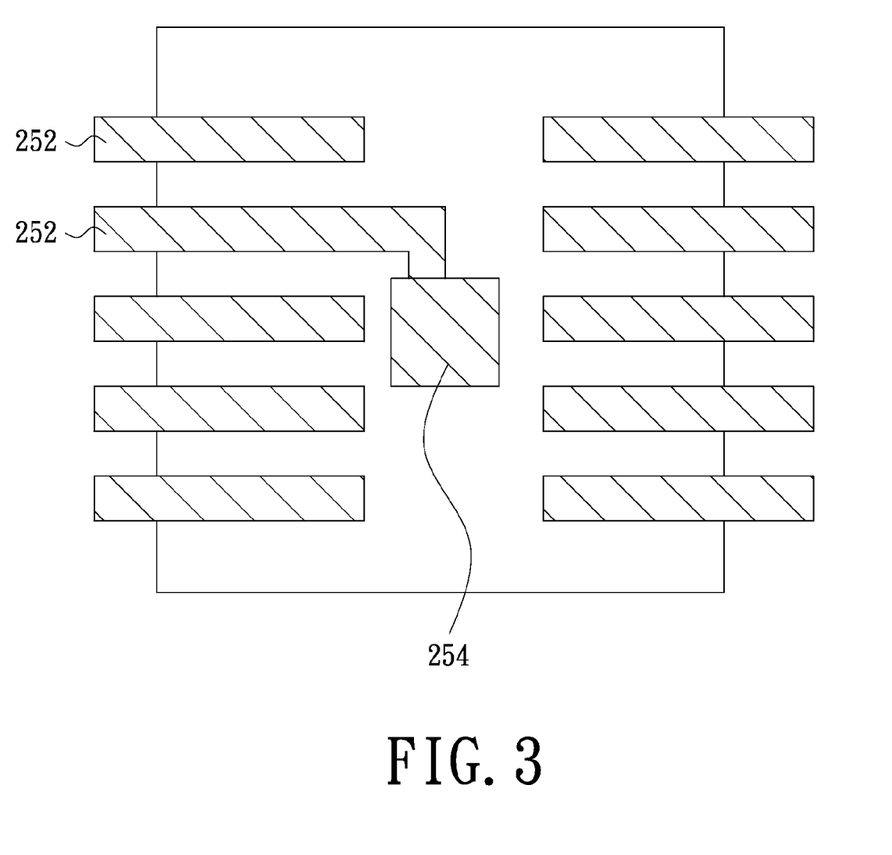
FIG. 3 is a schematic, top view of first leads and a second lead of the chip package structure of an embodiment of the present invention.

FIG. 2 is a schematic, cross sectional view of a chip package structure according to an embodiment of the present invention. FIG. 3 is a schematic, top view of first leads and a second lead of the chip package structure of an embodiment of the present invention. Referring to FIG. 2, the chip package structure 200 of the present embodiment includes a silicon substrate 210, a sensing component 220, a metal circuit layer 230, a first insulating layer 240 and a conductive metal layer 250. The silicon substrate 210 has a first surface 212 and a second surface 214 opposite to the first surface 212. The sensing component 220 and the metal circuit layer 230 are disposed on the first surface 212 of the silicon substrate 210. The sensing component 220 may be, but not limited to, an optical sensing component. The metal circuit layer 230 is electrically connected to the sensing component 220. The first insulating layer 240 covers the second surface 214 of the silicon substrate 210, and has a first through hole 242 to expose a portion of the second surface 214 of the silicon substrate 210. The first insulating layer 240 may be, but not limited to, a solder mask.

Referring to FIGS. 2 and 3, the conductive metal layer 250 is disposed on the first insulating layer 240. The conductive metal layer 250 includes a plurality of first leads 252 and a second lead 254. In the present embodiment, the first leads 252 are electrically connected to the metal circuit layer 230. The second lead 254 is filled in the first through hole 242 of the first insulating layer 240 so as to electrically connect to the silicon substrate 210. Moreover, the second lead 254 is further electrically connected to at least one of the first leads 252. The first lead 252 electrically connected to the second lead 254 may be, but not limited to, a ground lead or a power lead, such that the silicon substrate 210 can be electrically connected to the ground or to an external power device by the first lead 252 electrically connected to the second lead 254. In addition, the silicon substrate 210 is capable of being electrically connected to the ground directly, and this facilitates performing a signal test to the silicon substrate 210, and maintaining the electrical potential of the silicon substrate 210 at the lowest electric potential.

In the present embodiment, the conductive metal layer 250 may include a plurality of sub-metal layers. For example, the conductive metal layer 250 includes a first sub-metal layer 253 and a second sub-metal layer 255 stacked together with the first sub-metal layer 253. The first sub-metal layer 253 is different from the second sub-metal layer 255. Material of the first sub-metal layer 253 may include, but not limited to, aluminum or copper, and material of the second sub-metal layer 255 may include, but not limited to, nickel or gold. The first sub-metal layer 253 is, for example, disposed between the second sub-metal layer 255 and the first insulating layer 240 for being adhered to the second sub-metal layer 255 and the first insulating layer 240.

The chip package structure 200 of the present embodiment, for example, further includes a second insulating layer 280 and a plurality of solder balls 290. The second insulating layer 280 is disposed on the first insulating layer 240 and covers the conductive metal layer 250. The second insulating layer 280 may be, but not limited to, a solder mask layer. The second insulating layer 280 includes a plurality of second through holes 282 to expose a portion of each first lead 252. The solder balls 290 are disposed in the second through holes 282 so as to be electrically connected to the corresponding first leads 252.

The chip package structure 200, for example, further includes a protective layer 260 to cover the sensing component 220 and the metal circuit layer 230. The protective layer 260 may be, but not limited to, made of epoxy resin. The chip package structure 200 may further include a protective substrate 270 disposed on the protective layer 260. In the present embodiment, the sensing component 220 is, for example, an optical sensing component, and therefore, the protective substrate 270 may be a transparent substrate such as a glass substrate.

It should be noted that the first leads 252 may be electrically connected to the metal circuit layer 230 by other means. For example, in other embodiments, the metal circuit layer 230 may be electrically connected to the first leads 252 by through silicon vias (TSVs) defined in the silicon substrate 210.

The following description is about a chip packaging process for fabricating the chip package structure 200.

Figure 4A:
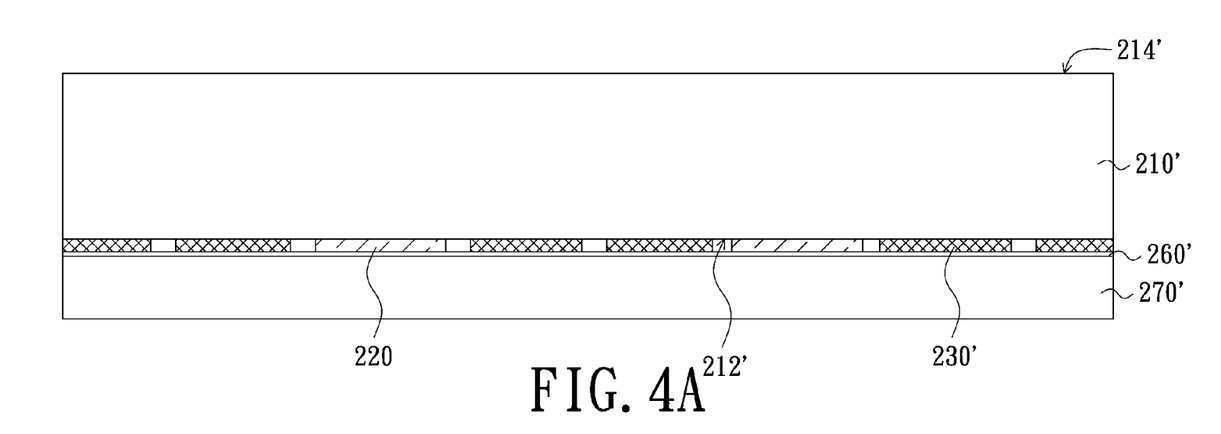

FIGS. 4A to 4M show a flow chart of a chip packaging process according to an embodiment of the present invention. Referring to FIG. 4A, the chip packaging process of the present embodiment includes a step of providing a silicon wafer 210'. The silicon wafer 210' has two opposite surfaces, i.e., the first surface 212' and the second surface 214'. A metal circuit layer 230' and a plurality of sensing components 220 electrically connected to the metal circuit layer 230' are disposed on the first surface 212' of the silicon wafer 210'. Furthermore, in an embodiment, a protective layer 260' may be disposed on one side of the first surface 212' of the silicon wafer 210' so as to cover and protect the metal circuit layer 230' and the sensing components 220. The protective layer 260' may be transparent layer, and material of the protective layer 260', for example, includes epoxy resin. In addition, a protective substrate 270' may be disposed on the protective layer 260'. The protective substrate 270' may be a transparent substrate such as a glass substrate.

Figure 4B:
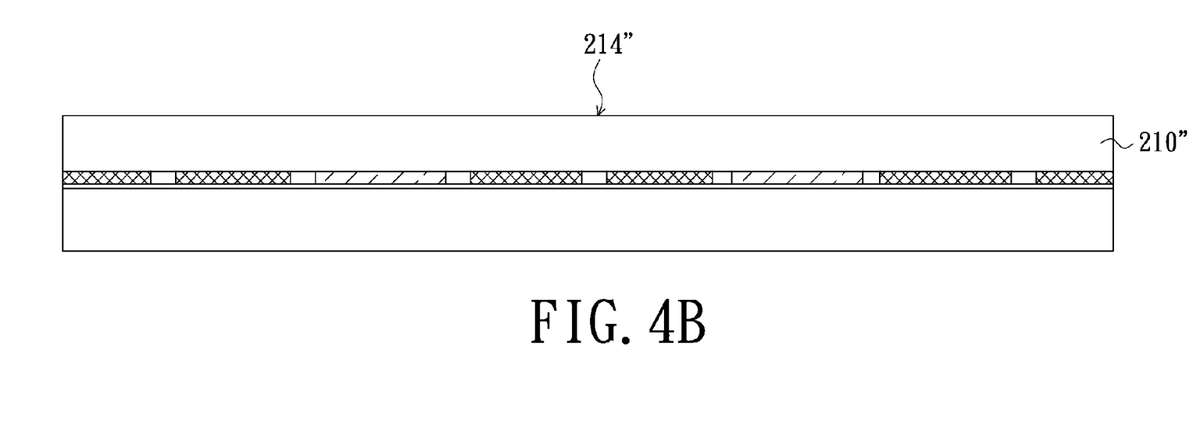

After disposing the protective substrate 270', a wafer thinning process is selectively performed for decreasing a thickness of the silicon wafer 210' to a suitable thickness. Also referring to FIGS. 4A to 4B, the wafer thinning process may include a step of grinding the second surface 214' of the silicon wafer 210' shown in FIG. 4A for decreasing the thickness of the silicon wafer 210'. The thickness decreased silicon wafer is labeled by 210" in FIG. 4B, and the second surface labeled by 214" is a grinding surface. Then, a planarization process such as an etching process for the second surface 214" of the silicon wafer 210" is performed to flat the second surface 214" and releasing the stress in the second surface 214".

Figure 4C:
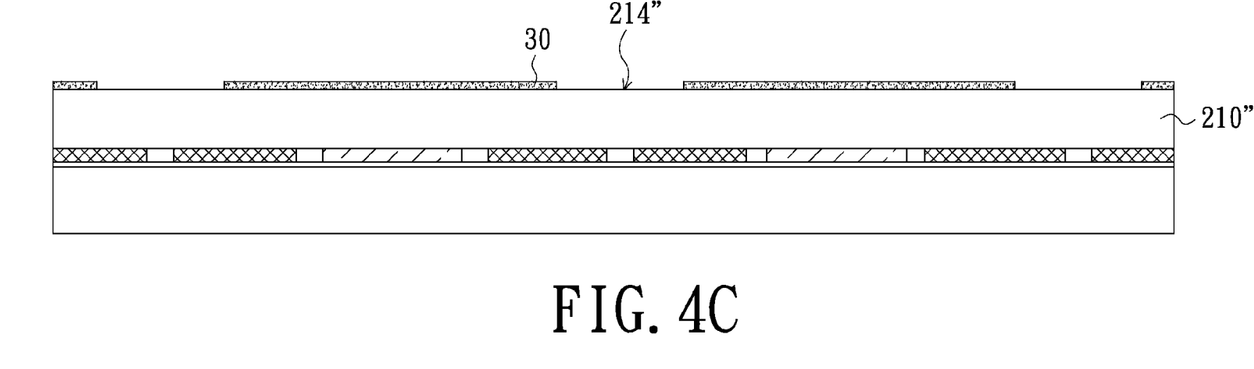
Figure 4D:
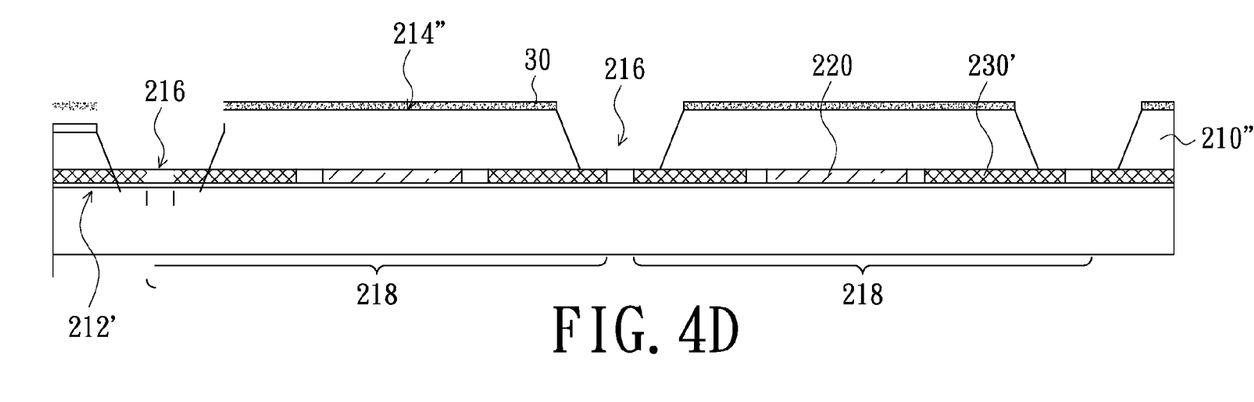
Figure 4E:
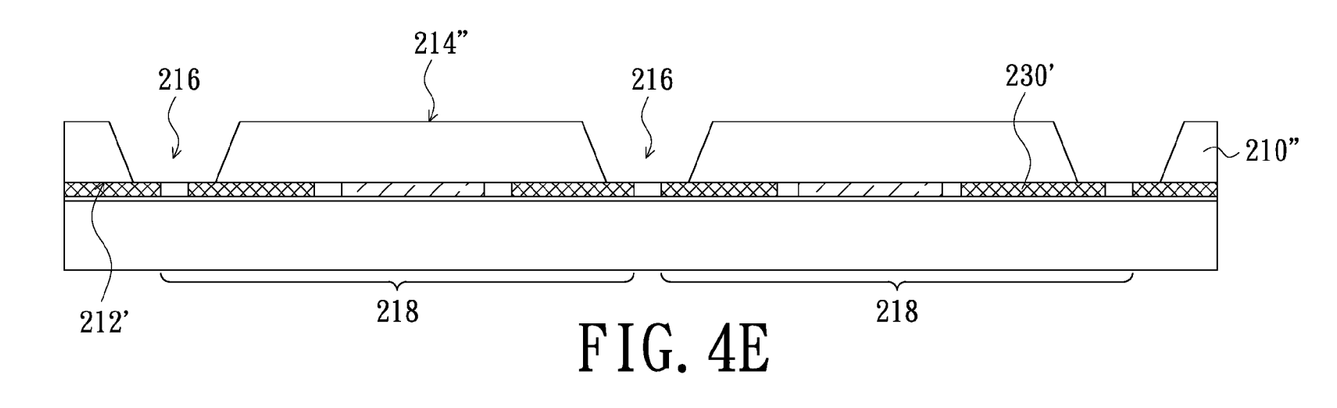

Then, referring to FIGS. 4C to 4E, a plurality of notches 216 are formed in the silicon wafer 210" for defining a plurality of chip units 218 and exposing a portion of the metal circuit layer 230'. The chip unit 218 is formed between adjacent notches 216, and each of the chip units 218 includes one of the sensing components 220. More concretely, the step of forming the notches 216 for example, includes forming a patterned photoresist layer 30 on the second surface 214" of the silicon wafer 210" as shown in FIG. 4C. The portion of the second surface 214" which is not covered by the patterned photoresist layer 30 is the predetermined area for forming the notches. Next, as shown in FIG. 4D, the patterned photoresist layer 30 is functioned as a mask for the etching process. A portion of the silicon substrate 210" is removed for forming the notches 216 passing through the first surface 212' and the second surface 214", and a portion of the metal circuit layer 230' is exposed by the notches 216. Then, as shown in FIG. 4E, the patterned photoresist layer 30 as shown in FIG. 4D is removed.

It should be noted that, the method of forming the notches 216 is not limited to the lithography etching method as disclosed in this embodiment. The notches may be formed by other methods, such as mechanical cutting, laser cutting, or etc.

Figure 4F:
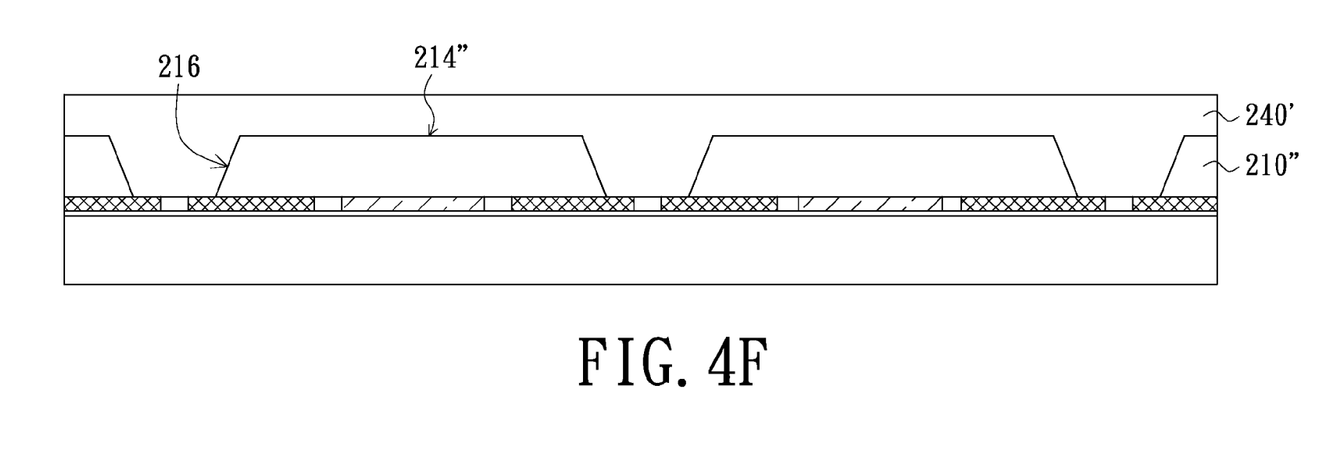

Then, referring to FIG. 4F, a first insulating layer 240' is formed on the second surface 214" of the silicon wafer 210" and is further filled in the notches 216. The first insulating layer 240' may be, but not limited to, a solder mask layer.

Figure 4G:
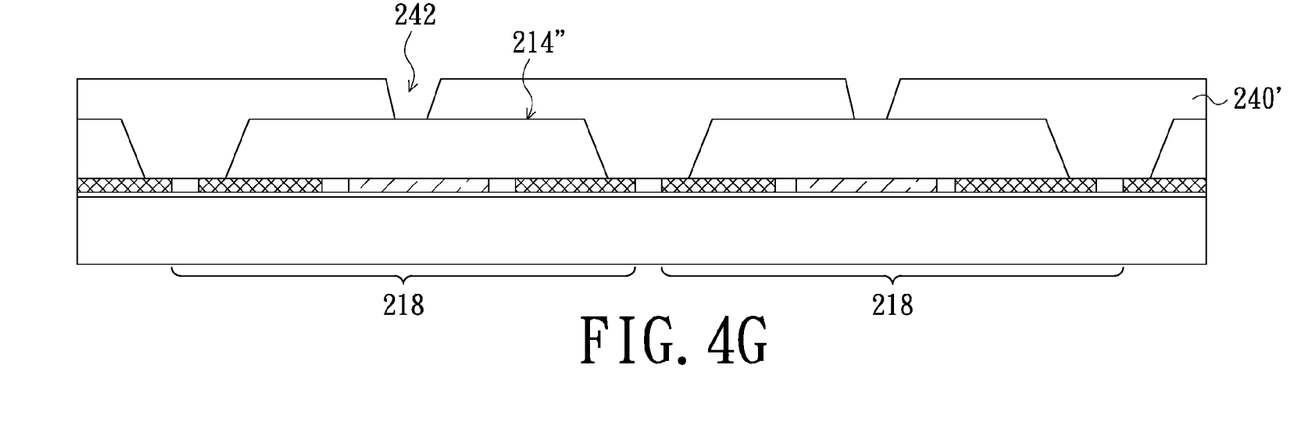
Figure 4H:
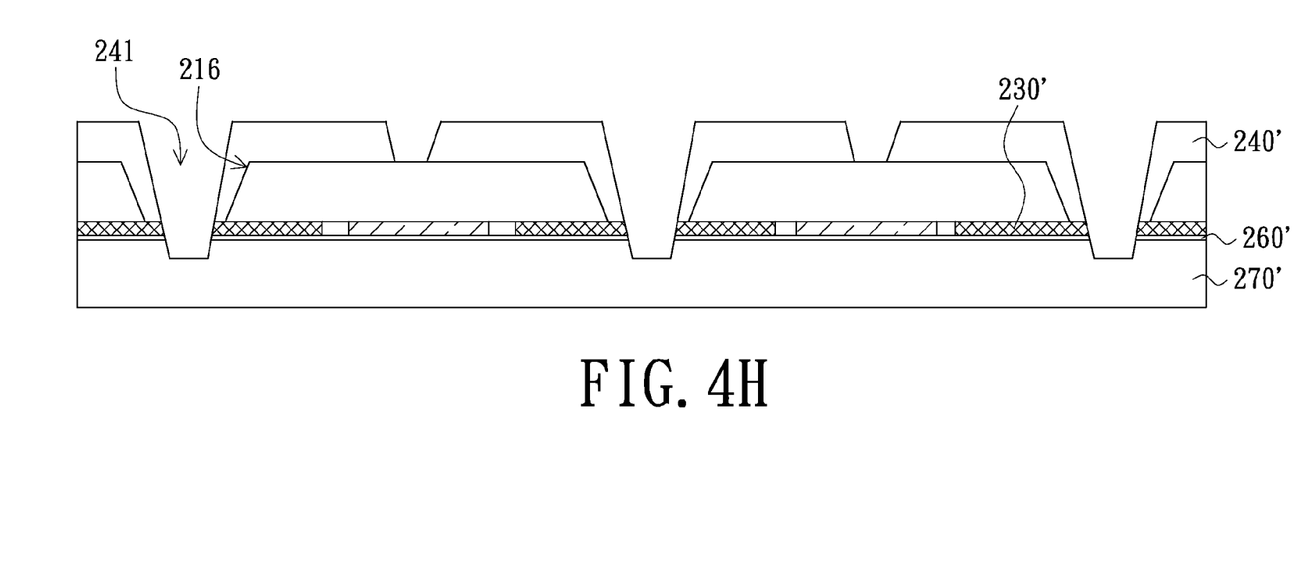

Next, referring to FIGS. 4G and 4H, a plurality of openings 241 and a plurality of first through holes 242 are formed in the first insulating layer 240'. The openings 241 and the first through holes 242 may be formed by etching, machining, laser processing or etc. More concretely, the step of forming the first through holes 242 and the openings 241, for example, includes forming the first through holes 242 in the first insulating layer 240' as shown in FIG. 4G, wherein the portion of the first insulating layer 240' corresponding to each of the chip units 218 has a first through hole 242 for exposing a portion of the second surface 214" of the silicon wafer 210". The first through holes 242 may be, but not limited to, circular or square configuration. Then, as shown in FIG. 4H, the openings 241 are formed in the first insulating layer 240'. The openings 241 are located in and correspond to the notches 216 respectively. It should be noted that, in the present embodiment, the openings 241 formed in the first insulating layer 240' should expose the metal circuit layer 230' so as to electrically connect the metal circuit layer 230' to outside. Moreover, when forming the openings 241, portions of the metal circuit layer 230', the protective layer 260' and the protective substrate 270' may be removed such that the openings 241 could extend downwardly to the protective substrate 270'.

Figure 4I:
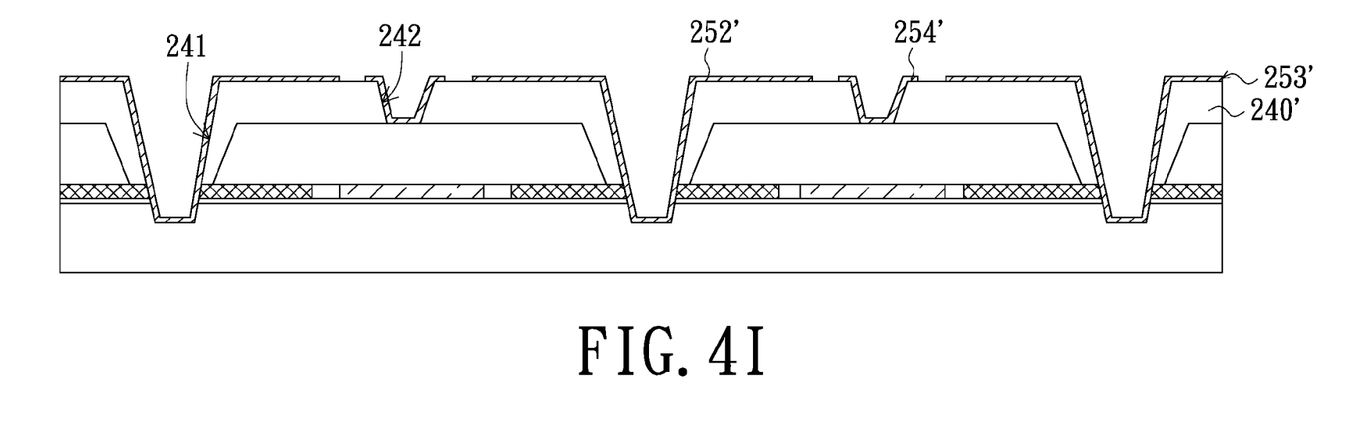
Figure 4J:
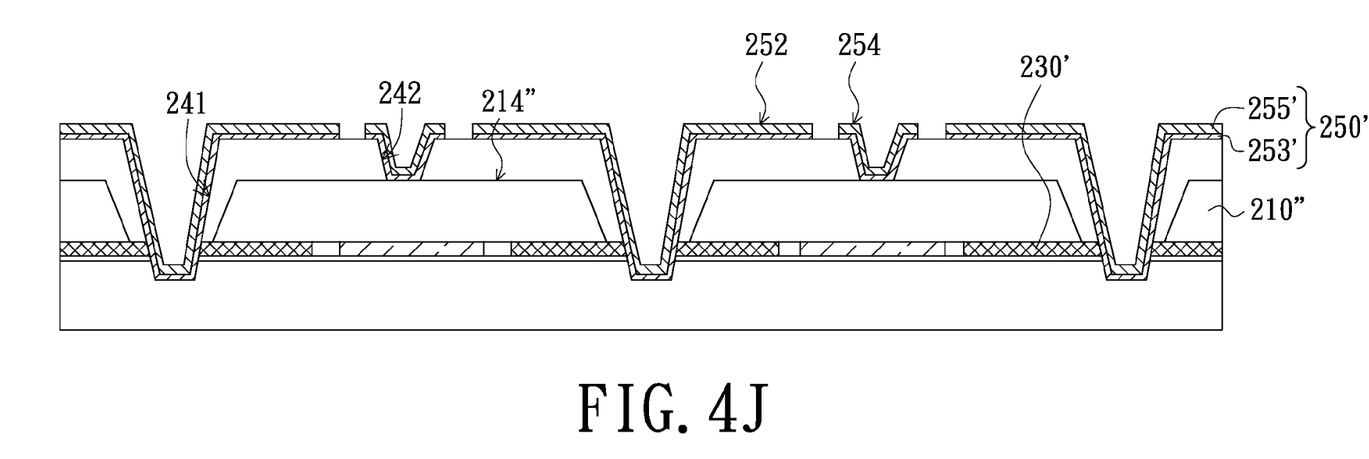

Then, referring to FIGS. 4I to 4J, a conductive metal layer 250' is formed on the first insulating layer 240'. In the present embodiment, the conductive metal layer 250' may include a plurality of sub-metal layers such as the first sub-metal layer 253' and the second sub-metal layer 255'. More concretely, the method of forming the conductive metal layer 250' includes the following steps. First, referring to FIG. 4I, the first sub-metal layer 253' is formed for covering the first insulating layer 240', and the first sub-metal layer 253' is filled in the openings 241 and the first through holes 242. Then, the first sub-metal layer 253' is etched for forming a plurality of first leads 252' and a plurality of second leads 254'. Then, referring to FIG. 4J, the second sub-metal layer 255' is formed to stack on the first leads 252' and the second leads 254'. The first leads 252 shown in FIG. 2 include the first leads 252' and the portions of the second sub-metal layer 255' stacked on the first leads 252'. The second leads 254 shown in FIG. 2 include the second leads 254' and the portions of the sub-metal layer 255' stacked on the second leads 254'. In the present embodiment, the conductive metal layer 250' includes the first leads 252 and the second leads 254. The first leads 252 are filled in the openings 241 and electrically connected to the metal circuit layer 230'. The second leads 254 are respectively filled in the first through holes 242 and electrically connected to the silicon substrate 210".

In another embodiment, the method of forming the conductive metal layer 250' may include the following steps. First, the first sub-metal layer 253' is formed for covering the first insulating layer 240, and the first sub-metal layer 253' is filled in the openings 241 and the first through holes 242. Then, the second sub-metal layer 255' is formed for covering the first sub-metal layer 253'. Next, the first sub-metal layer 253' and the second sub-metal layer 255' are etched for forming the first leads 252 and the second leads 254.

Then, referring to FIG. 3, each of the chip units 218 includes the first leads 252 and the second lead 254. During the etching process to form the first leads 252 and the second lead 254, the second lead 254 is formed to electrically connect to at least one of the first leads 252. Therefore, the second lead 254 may be electrically connected to outside component by the first lead 252. In the present embodiment, the second lead 254 is electrically connected to one of the first leads 252. The first lead 252 electrically connected to the second lead 254 is, for example, a ground lead or a power lead.

Figure 4K:
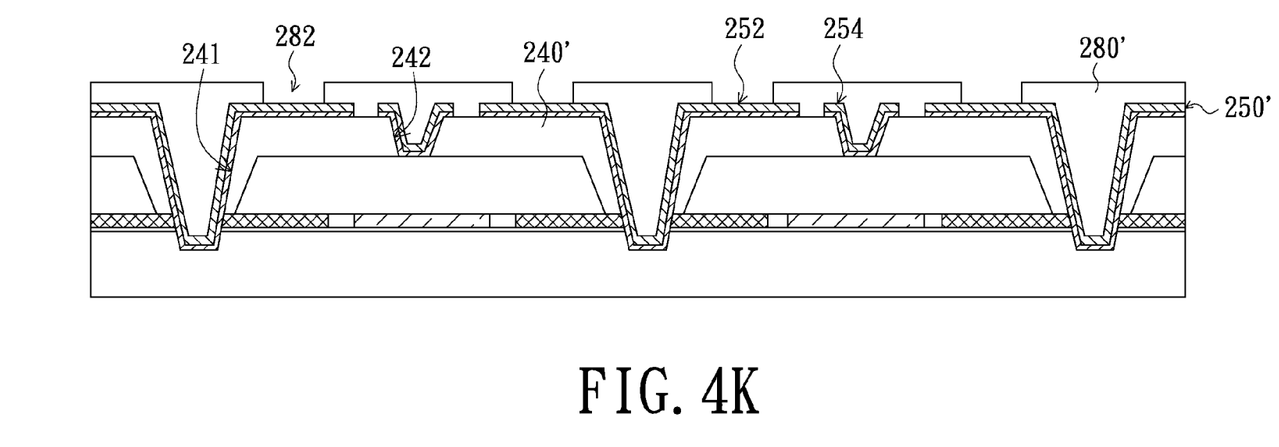
Figure 4L:
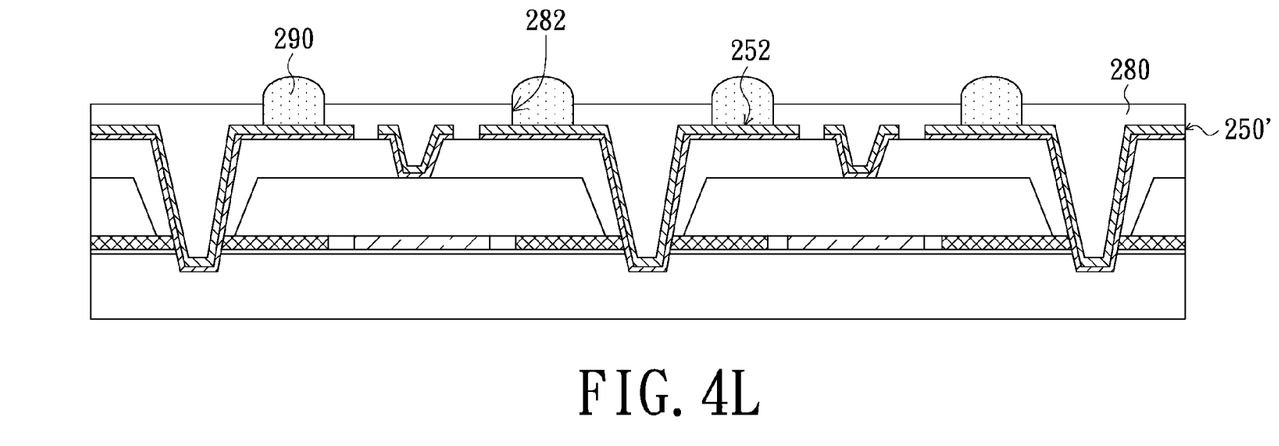

Referring to FIG. 4K, after forming the first leads 252 and the second leads 254, a second insulating layer 280' is selectively formed on the first insulating layer 240'. The second insulating layer 280' is filled in the openings 241 and the first through holes 242, and covers the conductive metal layer 250'. Then, a plurality of second through holes 282 are formed in the second insulating layer 280' to expose a portion of each first lead 252. Then, as shown in FIG. 4L, a plurality of solder balls 290 are disposed in the second through holes 282 respectively, and electrically connected to the first leads 252. Therefore, the second insulating layer 280 may protect the conductive metal layer 250', and the conductive metal layer 250' may electrically connect to outside component by the solder balls 290.

Figure 4M:
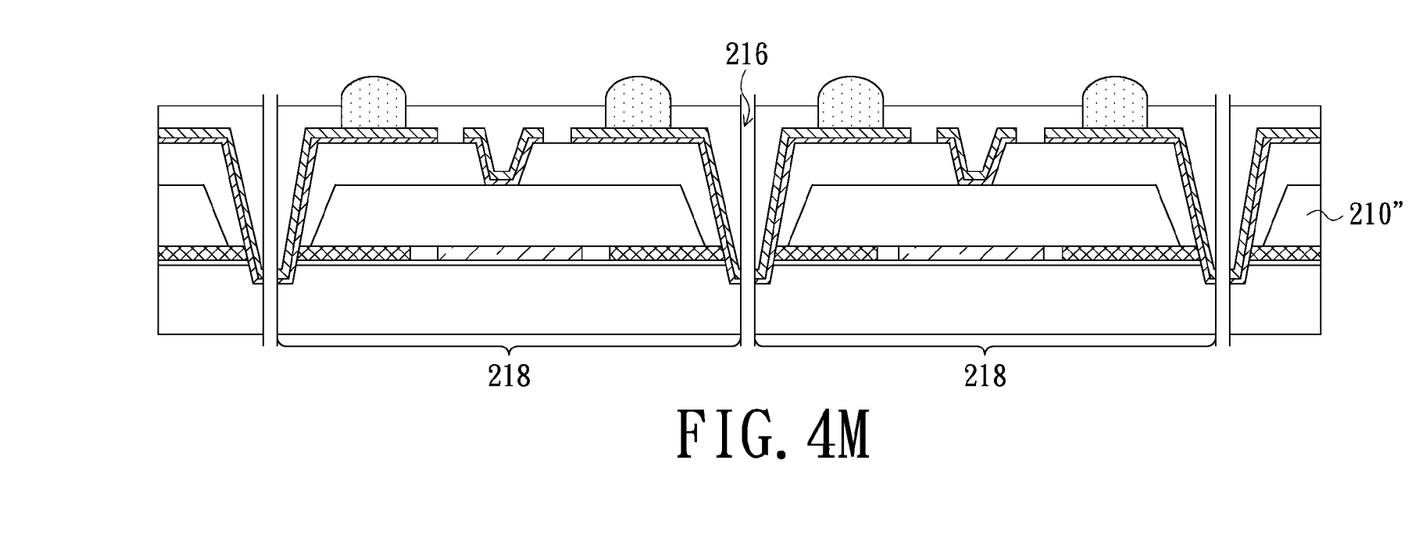

Then, referring to FIG. 4M, the silicon wafer 210" is cut along the notches 216 for separating the chip units 218, wherein each of the chip units 218 is the chip package structure 200 shown in FIG. 2. The silicon substrate 210 of FIG. 2 is a portion of the silicon wafer 210'.

It should be noted that, in the chip packaging process of the present embodiment, the first leads 252 are filled in the openings 241 to electrically connect to the metal circuit layer 230, but the manner to let the metal circuit layer 230 be electrically connected to the first leads 252 is not limited by the present embodiment. Therefore, the steps of the chip packaging process will be accordingly different. For example, in another embodiment, when the metal circuit layer is electrically connected to the first leads by through silicon vias formed in the silicon substrate, the chip packaging process includes the step of forming the through silicon vias in the silicon wafer to let the first leads be electrically connected to the metal circuit layer by the through silicon vias.

In summary, in the chip package structure and the chip packaging process of the present invention, the second lead disposed in the first through holes defined in the first insulating layer enables the silicon substrate to be electrically connected to outside component (such as the printed circuit board) directly. Therefore, the silicon substrate could be electrically connected to ground directly, and this facilitates performing a signal test to the silicon substrate and maintaining the electrical potential of the silicon substrate at the lowest electric potential.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip package structure, comprising:
    a silicon substrate having a first surface and a second surface opposite to the first surface;
    a sensing component disposed on the first surface of the silicon substrate;
    a metal circuit layer disposed on the first surface of the silicon substrate and electrically connected to the sensing component;
    a first insulating layer covering the second surface of the silicon substrate and having a first through hole to expose a portion of the second surface; and
    a conductive metal layer disposed on the first insulating layer, the conductive metal layer comprising:
        a plurality of first leads electrically connected to the metal circuit layer; and
        a second lead filled in the first through hole to electrically connect to the silicon substrate and at least one of the first leads.

2. The chip package structure according to claim 1 further comprising a protective layer, wherein the metal circuit layer and the sensing component are covered by the protective layer.

3. The chip package structure according to claim 2, wherein the protective layer is made of epoxy resin.

4. The chip package structure according to claim 2 further comprising a protective substrate disposed on the protective layer.

5. The chip package structure according to claim 4, wherein the protective substrate is a transparent substrate.

6. The chip package structure according to claim 1, wherein the first lead electrically connected to the second lead is a ground lead or a power lead.

7. The chip package structure according to claim 1 further comprising:
    a second insulating layer covering the first leads and the second lead, wherein the second insulating layer has a plurality of second through holes to expose a portion of each first lead; and
    a plurality of solder balls respectively disposed in the second through holes to electrically connect to the first leads.

8. The chip package structure according to claim 1, wherein the silicon substrate has a plurality of through silicon vias, and the first leads are electrically connected to the metal circuit layer by the through silicon vias.

9. The chip package structure according to claim 1, wherein the conductive metal layer comprises a plurality of sub-metal layers, the sub-metal layers comprise a first sub-metal layer and a second sub-metal layer stacked together with the first sub-metal layer, the first sub-metal layer is different from the second sub-metal layer, the first sub-metal layer is disposed between the second sub-metal layer and the first insulating layer for being adhered to the second sub-metal layer and the first insulating layer.

10. A chip packaging process comprising:
    providing a silicon wafer, the silicon wafer having a first surface and a second surface opposite to the first surface, the first surface having a metal circuit layer and a plurality of sensing components electrically connected to the metal circuit layer;

forming a plurality of notches in the silicon wafer for defining a plurality of chip units and exposing the metal circuit layer, wherein each of the chip units comprises one of the sensing components;

forming a first insulating layer on the second surface of the silicon wafer and the first insulating layer being further filled in the notches;

forming a plurality of openings in the first insulating layer, the openings being correspondingly located in the notches, and forming a plurality of first through holes in portions of the first insulating layer corresponding to the chip units to expose portions of the second surface of the silicon wafer;

forming a conductive metal layer on the first insulating layer, the conductive metal layer comprising a plurality of first leads and a plurality of second leads, the first leads being electrically connected to the metal circuit layer, the second leads being filled in the first through holes respectively to be electrically connected to the silicon wafer and at least one of the first leads; and cutting the silicon wafer along the notches for separating the chip units.

11. The chip packaging process according to claim 10, wherein before forming the notches, the chip packaging process further comprises forming a protective layer on the silicon wafer to cover the metal circuit layer and the sensing components.

12. The chip packaging process according to claim 11 further comprising disposing a protective substrate on the protective layer.

13. The chip packaging process according to claim 12, wherein the protective substrate is a transparent substrate.

14. The chip packaging process according to claim 12, wherein after disposing the protective substrate, the chip packaging process further comprises performing a wafer thinning process, and the wafer thinning process comprises:
grinding the second surface of the silicon wafer for forming a grinding surface; and
performing a planarization process for the grinding surface.

15. The chip packaging process according to claim 10, wherein a method of forming the notches comprises performing a lithography etching process.

16. The chip packaging process according to claim 10, wherein after forming the openings, the metal circuit layer is exposed, and when forming the conductive metal layer, the conductive metal layer is filled in the openings to let the first leads be electrically connected to the metal circuit layer.

17. The chip packaging process according to claim 16, wherein the conductive metal layer comprises a plurality of sub-metal layers, and a method of forming the conductive metal layer comprises:
forming a first sub-metal layer to cover the first insulating layer and the first sub-metal layer being further filled in the openings and the first through holes;
etching the first sub-metal layer to form the first leads and the second leads; and
forming a second sub-metal layer to stack on the first leads and the second leads.

18. The chip packaging process according to claim 16, wherein the conductive metal layer comprises a plurality of sub-metal layers, and a method of forming the conductive metal layer comprises:
forming a first sub-metal layer to cover the first insulating layer and the first sub-metal layer being further filled in the openings and the first through holes;
forming a second sub-metal layer to cover the first sub-metal layer; and
etching the first sub-metal layer and the second sub-metal layer to form the first leads and the second leads.

19. The chip packaging process according to claim 18, wherein material of the first sub-metal layer comprises aluminum or copper, and material of the second sub-metal layer comprises nickel or gold.

20. The chip packaging process according to claim 16 further comprising:
forming a second insulating layer on the first insulating layer to cover the first leads and the second leads;
forming a plurality of second through holes in the second insulating layer to expose a portion of each first lead;
forming a plurality of solder balls in the second through holes to electrically connect to the first leads, respectively.

21. The chip packaging process according to claim 10 further comprising:
forming a plurality of through silicon vias in the silicon wafer, wherein the first leads are electrically connected to the metal circuit layer by the through silicon vias.

* * * * *